US007663201B2

(12) United States Patent
Yamada

(10) Patent No.: US 7,663,201 B2
(45) Date of Patent: Feb. 16, 2010

(54) SEMICONDUCTOR DEVICE WITH A DIFFUSION BARRIER FILM HAVING A SPACING FOR STRESS RELIEF OF SOLDER BUMP

(75) Inventor: Yukiko Yamada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 585 days.

(21) Appl. No.: 11/447,966

(22) Filed: Jun. 7, 2006

(65) Prior Publication Data

US 2006/0278984 A1 Dec. 14, 2006

(30) Foreign Application Priority Data

May 12, 2006 (JP) .............................. 2006-133823
Jun. 10, 2006 (JP) .............................. 2005-171317

(51) Int. Cl.
 *H01L 21/44* (2006.01)
 *H01L 21/4763* (2006.01)
 *H01L 29/40* (2006.01)

(52) U.S. Cl. .................... 257/459; 257/751; 257/758; 257/760; 257/E23.015; 438/612; 438/622; 438/627; 438/643; 438/653

(58) Field of Classification Search ................ None
See application file for complete search history.

(56) References Cited

U.S. PATENT DOCUMENTS

| 6,191,023 B1* | 2/2001 | Chen ......................... 438/612 |
| 6,913,946 B2* | 7/2005 | Lin ............................ 438/106 |
| 2002/0125569 A1* | 9/2002 | Fukuda et al. ............... 257/737 |
| 2004/0070079 A1* | 4/2004 | Huang et al. ................ 257/778 |
| 2005/0014356 A1* | 1/2005 | Pozder et al. ............... 438/614 |
| 2005/0140027 A1* | 6/2005 | Fan ............................ 257/779 |
| 2005/0208751 A1* | 9/2005 | Oh et al. ..................... 438/614 |

FOREIGN PATENT DOCUMENTS

JP  2000-299343  10/2000

* cited by examiner

*Primary Examiner*—Matthew C Landau
*Assistant Examiner*—James M Mitchell
(74) *Attorney, Agent, or Firm*—Young & Thompson

(57) ABSTRACT

The present invention provides a semiconductor device exhibiting an improved reliability. A semiconductor device comprises a semiconductor chip having an electrode on a surface thereof and a mounting substrate, and the electrode (aluminum electrode) of the semiconductor chip is coupled to the mounting substrate through a bump (solder bump 104). A plurality of diffusion barrier films (UBM 112) for preventing a diffusion of a material composing the bump is provided between the electrode and the bump, and the diffusion barrier film is formed to have a plurality of divided portions via spacings therebetween.

7 Claims, 14 Drawing Sheets

PRIOR ART

PRIOR ART

SEMICONDUCTOR DEVICE WITH A DIFFUSION BARRIER FILM HAVING A SPACING FOR STRESS RELIEF OF SOLDER BUMP

This application is based on Japanese patent application Nos. 2005-171,317 and 2006-133823, the contents of which are incorporated hereinto by reference.

BACKGROUND OF THE INVENTION

1. Field of the Invention

The present invention relates to a semiconductor device having a semiconductor chip and a mounting substrate, which are mutually coupled via a bump.

2. Related Art

Typical structure of a conventional semiconductor chip is formed by wire-bonding an electrode provided on the semiconductor chip with a terminal lead disposed in a peripheral of a package and packaging the chip with an encapsulating resin.

Since maximum number of the terminal leads that can be mounted on the substrate is limited under the circumstances of requiring reduced spacing between the terminal leads for increasing number of the terminals in one semiconductor chip in the packaging process for such structure, it is inevitable to increase the dimension of the package for maintaining an appropriate spacing between terminal leads.

To solve such problem, chips including a bonding portion employing solder and bump, such as a type of package called a chip size package (CSP) and the like is proposed.

An exemplary implementation of a planar structure of a conventional CSP is shown in FIG. 9, and a typical cross-sectional structure and a manufacturing process is shown in FIGS. 10A to 10E. FIG. 9 is a plan view of a CSP 80 from the upper surface side, schematically showing solder bumps 54 in phantom.

As shown in FIG. 9 and FIGS. 10A to 10E, under bump metals (UBM) 12, which are disc-shaped hard Ni plated sheets, is provided on an aluminum electrode 50 in the conventional CSP 80.

The UBM 12 is a diffusion barrier film, functioning as inhibiting a diffusion of components of the solder bump 54 in an aluminum electrode 50. Further, a portion of the aluminum electrode 50 is coated with an SiON film 52 and a polyimide film 10. Further, a solder bump 54 is provided on the UBM 12.

Since the CSP such as the CSP 80 and the like is configured that interconnects are formed to extend from the electrode on the semiconductor chip to the solder bumps arranged in a lattice-shaped pattern on the surface of the package so that the formed interconnect does not exceed the width in the two-dimensional dimension of the semiconductor chip, a relatively smaller size of semiconductor package that is closer to the size of the semiconductor chip can be obtained, without any limitation in the arrangement of device electrodes arranged with a narrow interval on the semiconductor chip.

However, a thermal stress is caused by a difference in thermal expansion coefficients of materials of respective components such as the semiconductor chip and the mounting substrate and the like in the CSP having such miniaturized solder-joint, as shown in FIG. 11, strain may be possibly concentrated on the solder-bump junction, which has not higher structural strength.

Further, in a temperature cycling test or the like, a tensile compressive stress radially extending from a central portion of the semiconductor chip toward a circumference portion thereof as illustrated in FIG. 12 is generated between the ball bump and the mounting substrate by the difference in thermal shrinkages of the mounting substrate and the semiconductor chip, the generated stress is repeatedly exerted on the circumference portion of the contacting surface between the ball bump and the UBM.

In this case, in the conventional structure, the stress tends to be concentrated in particular on the circumference portion of the contacting surface between the ball bump and the UBM, when one piece of hard disc-shaped the UBM repeatedly moves, and therefore a crack may be possibly generated in an aluminum electrode provided under the UBM or in the semiconductor chip.

The semiconductor device described in Japanese Patent Laid-Open No. 2000-299,343 is obtained for inhibiting a breakage and/or a peeling-off of an UBM, a metallic electrode or an insulating film caused by such stress. As shown in FIG. 14, a semiconductor device 90 is composed of a copper interconnect pad 22 partially coated with an insulating film 20 and an insulating film 10, an UBM 12 provided in an portion that is not coated with the insulating film 20 covering a side surface of the copper interconnect pad 22 and the insulating film 10 partially covering the top surface of the copper interconnect pad 22, and a solder bump 4 provided on the UBM 12. In the semiconductor device 90, the width of one opening region is represented by "W".

As shown in FIG. 14, the semiconductor device 90 is designed to mount a solder bump via the UBM 124 by providing a frame of the insulating film 20 on the copper interconnect pad 22 that is a metallic electrode, and the UBM 12 and the copper interconnect pad 22 are configured to mutually contact only within the opening region of the insulating film 20.

In the semiconductor device 90, a contact area of the UBM 12 and the copper interconnect pad 22 is limited by the dimension of the opening of the insulating film 20. The stress exerted onto the UBM 12 is diminished by limiting the contact area.

However, relaxation of the stress by employing the above-described structure is strictly limited.

In order to solve these problems, the present inventors have eagerly continued the investigation, and then eventually obtained the following conclusion. The present inventors have concluded that, since the UBM is a continuous material consisting of integral films, the stress generated in the UBM is transferred through the interior of the UBM to be exerted on the UBM region except the opening region, even if a reduced width of the opening region is presented.

Further, the present inventors have also concluded that, the contact area between the bump and the UBM is not sufficiently smaller since a length of a side of the UBM along the stress direction is larger, even if the stress is exerted to the UBM from any direction, and thus the stress remains in an end of the UBM, even though the UBM is formed to have a corrugated geometry as in the technology described in Japanese Patent Laid-Open No. 2000-299,343, and therefore efficient relaxation of the stress created in the UBM is limited.

Further, although it is required to provide a broader width of the frame of the insulating film in order to reduce the stress transferred to the external of the opening region through the inside of the UBM, the broader width of the frame may possibly cause an increase in the area of the electrode and/or an increase in the contact resistance between the UBM and the metallic electrode. Configurations according to the present invention will be described as follows.

SUMMARY OF THE INVENTION

According to another aspect of the present invention, there is provided a semiconductor device, including a semiconductor chip having an electrode coupled to a mounting substrate via a bump formed on surface thereof, wherein a diffusion barrier film for preventing a diffusion of a material composing the bump is provided on a surface of the electrode, and the diffusion barrier film is formed to have a geometry including an spacing.

As described above, the diffusion barrier film is formed over the entire joined surface of the electrode with the bump in the conventional technology. On the contrary, the above-described aspect of the present invention is configured that the diffusion barrier film having the geometry including a spacing is provided on the above-described joined surface.

Since this configuration provides dividing the junction between the diffusion barrier film and the bump into a plurality of small areas, the thermal stress exerted on the junction is effectively dispersed to each of the small areas, thereby avoiding a concentration the stress in a single point.

While a stress is generally concentrated in a circumference of a junction of a diffusion barrier film with a bump, the configuration of the present invention provides a considerably reduced level of such stress concentration as compared with the conventional configuration. The aspect of the present invention achieves that a thermal stress created in the junction provided with the diffusion barrier film is considerably reduced.

As described above, according to the present invention, a semiconductor device, which is configured to be provided with a diffusion barrier film having a geometry of including a spacing on an electrode coupled to the bump, can be obtained. Thus, the stress created in the diffusion barrier film can be effectively dispersed and relaxed. Accordingly, a semiconductor device having an improved reliability and providing an inhibition to causing an adverse effect over the electrode and the semiconductor chip is provided.

BRIEF DESCRIPTION OF THE DRAWINGS

The above and other objects, advantages and features of the present invention will be more apparent from the following description taken in conjunction with the accompanying drawings, in which.

DETAILED DESCRIPTIONS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First embodiments according to the present invention will be described as follows in further detail, in reference to FIG. 1 to FIG. 5. In all figures, identical numeral is assigned to an element commonly appeared in the figures, and the detailed description thereof will not be presented.

Figure 1:
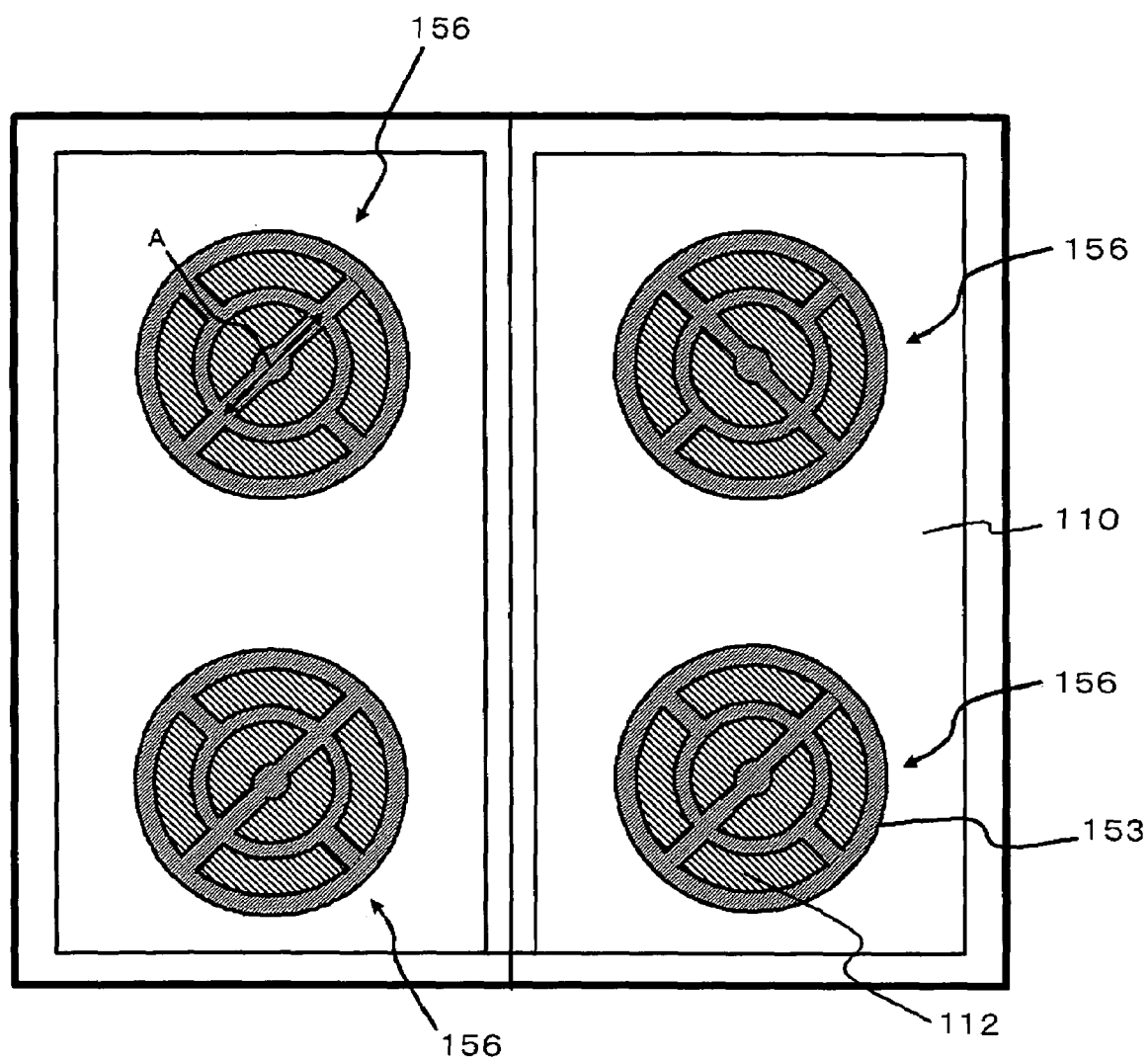
FIG. 1 is a plan view, schematically showing a semiconductor device according to a first embodiment.
Figure 2:
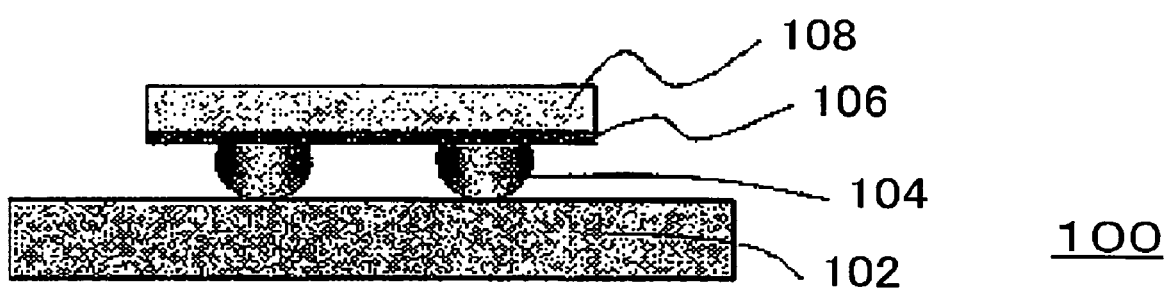
FIG. 2 is a plan view, schematically showing a semiconductor device according to a first embodiment.

A semiconductor device 100 shown in FIG. 1 and FIG. 2 comprises a semiconductor chip 108 and a mounting substrate 102, and the semiconductor chip 108 is coupled to the mounting substrate 102 through bumps (solder bumps 104).

The semiconductor chip 108 includes electrodes (aluminum electrodes 150) in a surface thereof that is coupled to a mounting substrate 102, and a plurality of diffusion barrier films (UBM 112) for preventing a diffusion of a material composing the bump is provided between the electrode and the bump, and further, a film (insulating film 153) composed of a material that is different from that composing the diffusion barrier film is disposed in a spacing between the plurality of diffusion barrier films.

FIG. 2 is a cross-sectional view, schematically illustrating a cross section of the semiconductor device 100 according to the present embodiment.

In the semiconductor device 100, the solder bumps 104 are provided on mounting substrate 102 that is composed of a printed circuit board, and the solder bumps 104 contact with an electrode 106 provided in the semiconductor chip 108. A portion of a circumference of the electrode 106 is coated with an insulating film 110 (FIG. 3E).

Hereinafter, in the semiconductor device 100, a configuration of a structure 180 composed of the electrode 106 and the solder bump 104 will be described in detail, in reference to FIG. 1 and FIG. 3E. Here, FIG. 1 is a plan view, schematically illustrating the solder bumps 104 in phantom in the structure 180, and FIG. 3E is a cross-sectional view of the structure 180.

The structure 180 is composed of the aluminum electrode 150, an insulating film 152, the insulating films 153, the insulating film 110, the under bump metal (UBM) 112 and the solder bump 104.

The aluminum electrode 150 composes a main part of the electrode 106 shown in FIG. 2, and is electrically coupled to the semiconductor chip 108.

The insulating film 152 is provided so as to cover a circumference of the top surface of the aluminum electrode 150. In the present embodiment, the insulating film 152 is composed of a plasma SiON film, and functions as providing an electrical insulation of a portion of the aluminum electrode 150.

The insulating films 153 are provided so as to cover portions in vicinity of the center of the top surface of the aluminum electrode 150 to form a stepping-stone pattern. In the present embodiment, the insulating films 153 are composed of a plasma SiON film, and function as providing an electrical insulation of a portion in vicinity of the center of the top surface of the aluminum electrode 150 and as dividing the UBM 112 into a plurality of regions by being arranged within respective plurality of spacings of the UBM. As shown in FIG. 1, a diameter A of a region provided in the inner portion of the insulating film composing the insulating film 153 in the present embodiment is 150 μm.

The insulating film 110 is provided so as to cover the top surface of the insulating film 152. In the present embodiment, the insulating film 110 is composed of a polyimide film, and functions as providing a protection to the insulating film 152.

The UBM 112 is provided within a substantially circular region (bonding region 156) that is not covered by the insulating film 152 and the insulating film 110 in the surface where the solder bump 104 joins to the aluminum electrode 150, do as to be divided into a plurality of regions.

As shown in FIG. 1, the aluminum electrode 150 of UBMs 112 form a two-dimensional pattern on the top surface thereof, in which four UBMs having a geometry obtained by dividing a ring into ¼ thereof (hereinafter referred to as ¼ ring-shaped geometry) are provided in an outer portion of a single bonding region 156, and two UBMs having a geometry similar to a semi circle are provided in an inner portion of such single bonding region 156.

In the present embodiment, two UBMs are provided in a single bonding region 156, extending from the center of bonding region 156 toward a circumference portion thereof. In the present embodiment, the UBM 112 is an under bump metal composed of a plated nickel (Ni), and functions as providing an inhibition to a diffusion of a component of the solder bump 104 toward the direction to the aluminum electrode 150. In the present embodiment, a diameter of the bonding region 156 is around 300 μm.

The solder bump 104 is provided so as to contact with the top surface of the UBM 112. In the present embodiment, the solder bump 104 is composed of lead free solder, and functions as electrically coupling the semiconductor chip 108 (FIG. 2) to the mounting substrate 102 (FIG. 2) by electrically coupling the mounting substrate 102 (FIG. 2) to the aluminum electrode 150.

As shown in FIG. 1 and FIG. 2 (plan view of FIG. 3E as will be discussed later), the aluminum electrode 150 is formed on the surface of the semiconductor chip 108 in the structure 180 of the semiconductor device 100. The insulating film 152, the insulating films 153 and the insulating film 110 are formed on the aluminum electrode 150 to have several circular or segmented opening. The inside of the opening is plugged with the UBM 112 consisting of nickel, and a plurality of UBMs 112 are provided to form a mutually independent and isolated relationship.

A process for manufacturing the structure 180 will be described as follows, in reference to FIG. 3A to FIG. 3E.

Figure 3A:
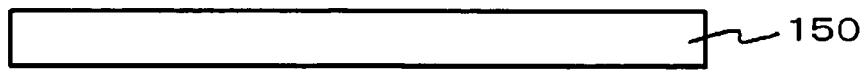
FIG. 3A to FIG. 3E are cross-sectional views of the semiconductor device, useful in describing a process for manufacturing the semiconductor device according to first embodiment.
Figure 3B:
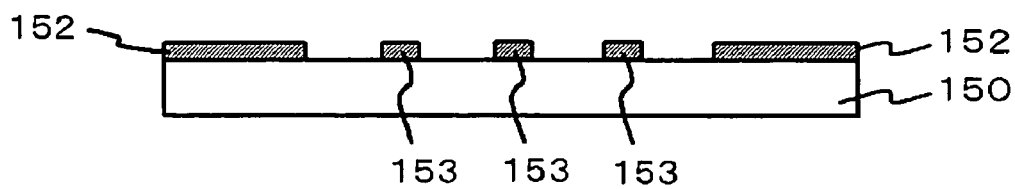

First of all, the aluminum electrode 150 is prepared on the semiconductor device (not shown) (FIG. 3A). Next, the insulating film 152 is provided so as to cover the circumference of the top surface of the aluminum electrode 150 via a chemical vapor deposition (CVD) process or the like, and the insulating films 153 are provided so as to cover portions in vicinity of the center of the top surface of the aluminum electrode 150 (FIG. 3B).

Figure 3C:
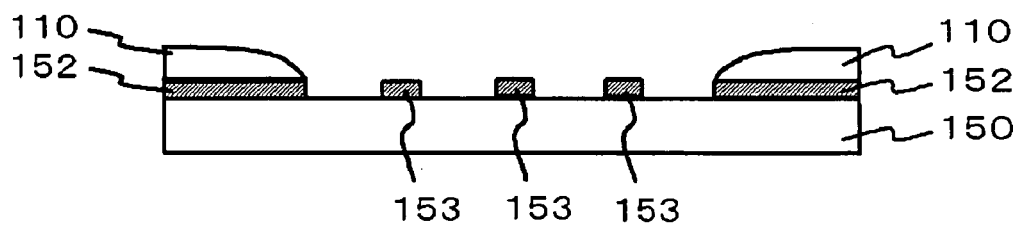

Subsequently, the insulating film 110 is provided via the CVD process so as to cover the insulating film 152 (FIG. 3C).

Figure 3D:
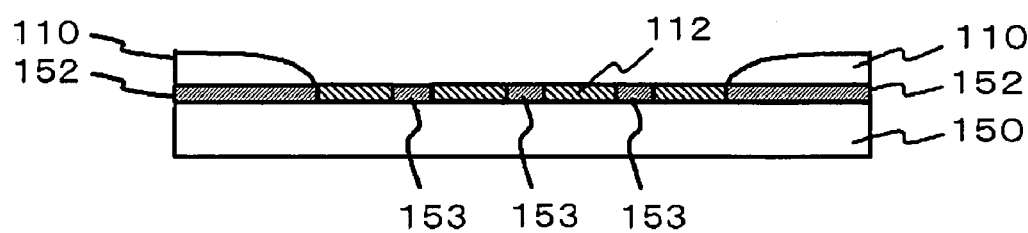
Figure 3E:
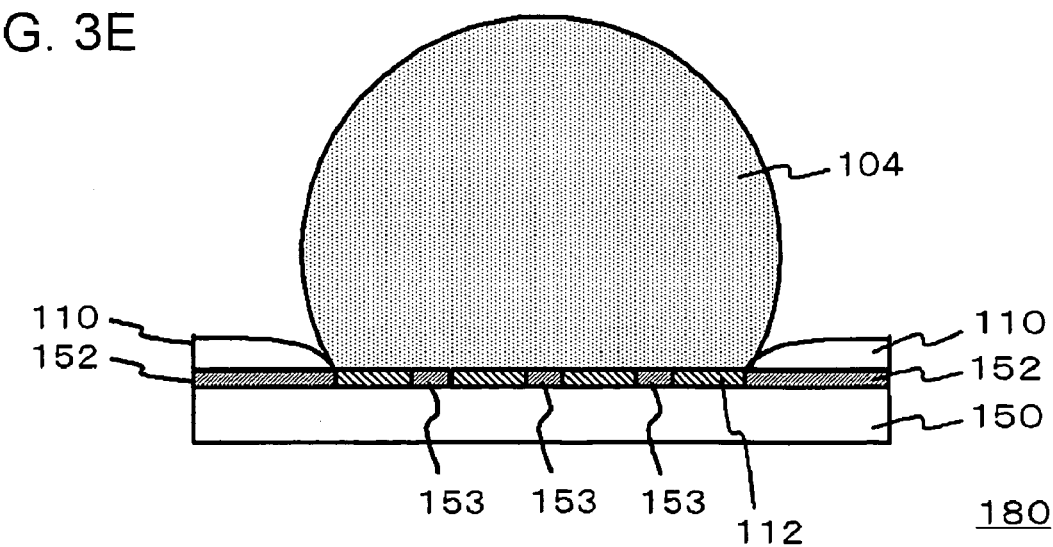

Subsequently, the UBMs 112 are provided on exposed portions in the top surface of the aluminum electrode 150 via an electroless plating process (FIG. 3D).

Next, the solder bump 104 is provided on the UBM 112 (FIG. 3E).

The structure 180 is formed by the above-mentioned process, and the mounting substrate 102 is provided on the solder bump 104 to form the semiconductor device 100.

Advantageous effects obtainable by employing the configurations of the structure 180 and the semiconductor device 100 will be described as follows.

As shown in FIG. 1 and FIG. 3A to FIG. 3E, in the structure 180, the insulating film 153 (passivating film) formed in the bonding region 156 is divided into several small areas form an island like-arranged pattern, and a plurality of UBMs 112 are provided to form a mutually independent and isolated relationship.

Figure 14:
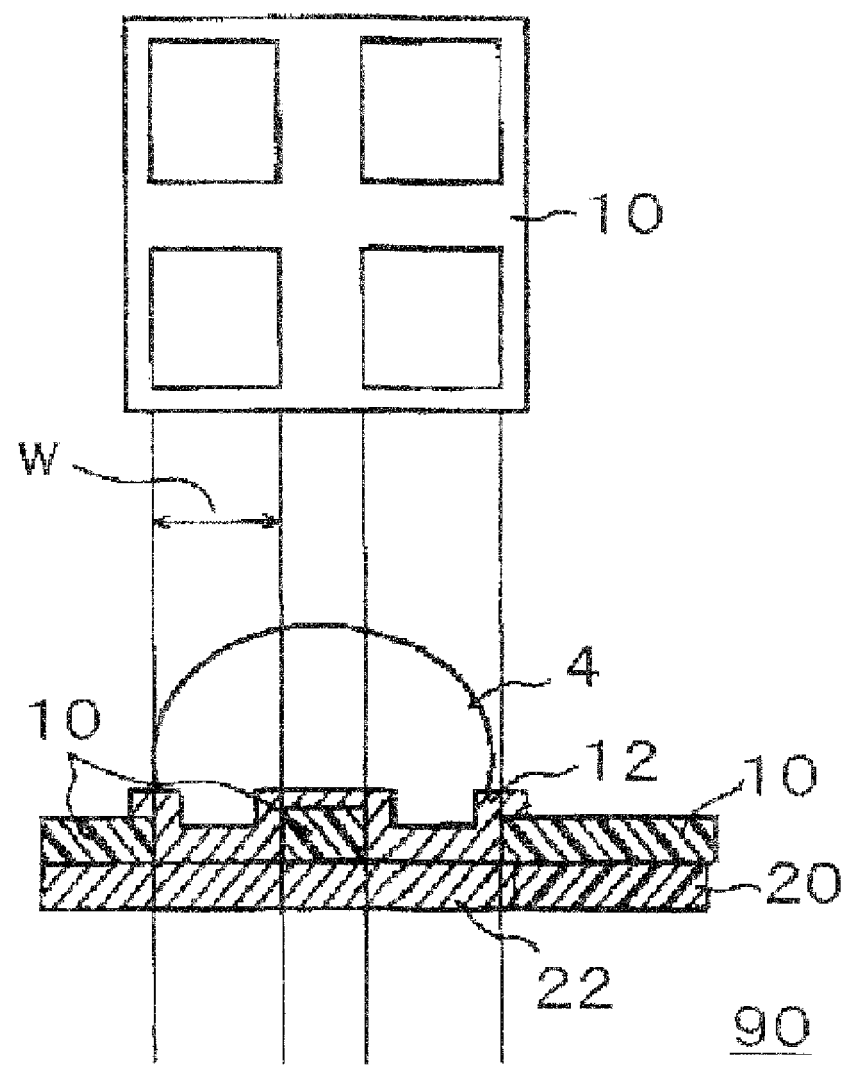
FIG. 14 includes a plan view and a cross-sectional view of the semiconductor device according to conventional technology.

More specifically, level of area and geometry/pattern of the contacting portion with the aluminum electrode 150, the UBMs 112 and the solder bump 104 are different from that of the conventional semiconductor device 90 (FIG. 14). Here, smaller stress radially extending toward a circumference portion from the center of the semiconductor chip 108 is exerted onto the circumference edge of the contact surface between the UBMs 112 and the solder bump 104, as level of area of the continuing contact surfaces is narrower.

Figure 4:
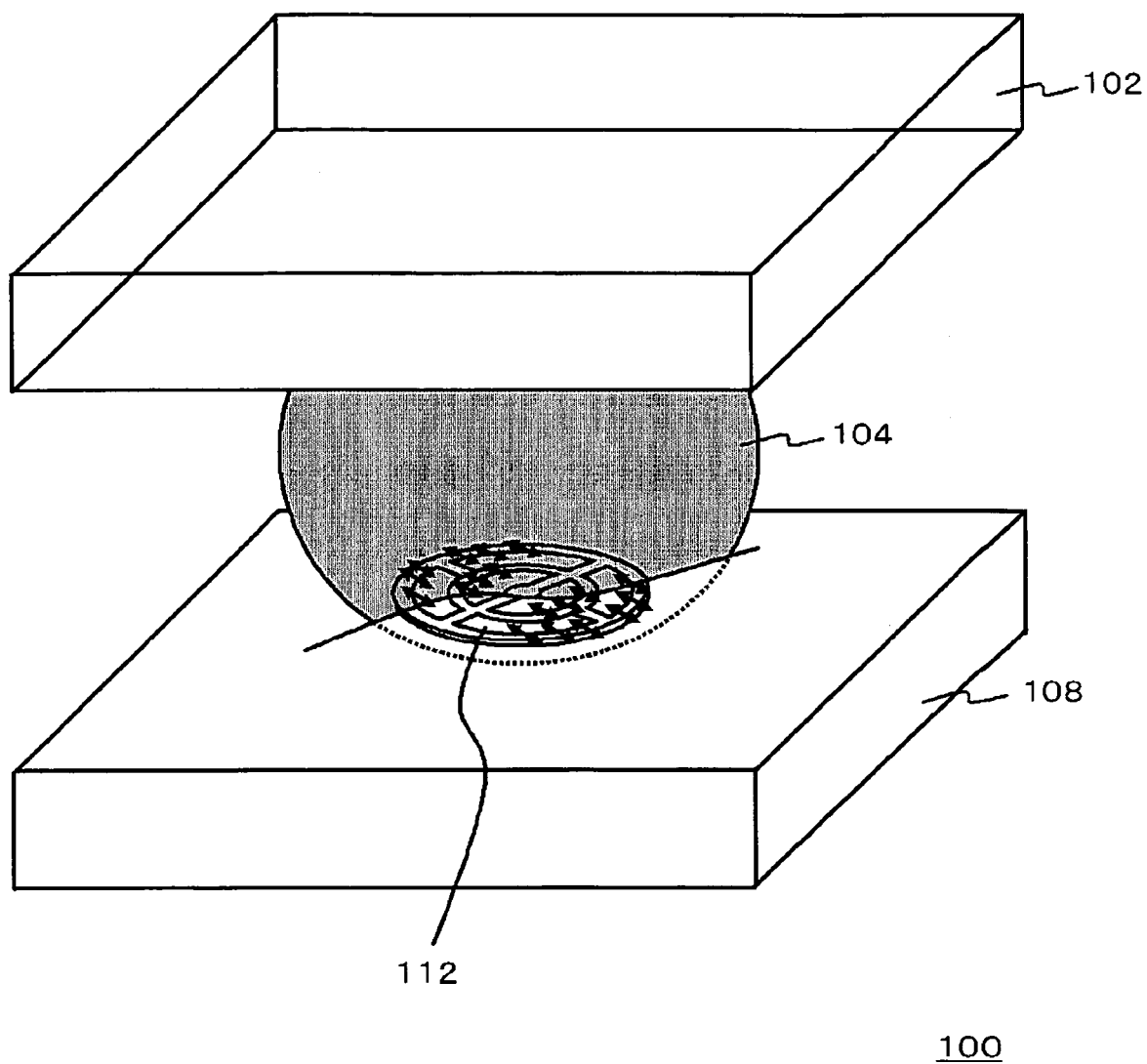
FIG. 4 is an partially cilipping perspective view of the semiconductor device, schematically illustrating a stress exerted onto the semiconductor device according to first embodiment.
Figure 5:
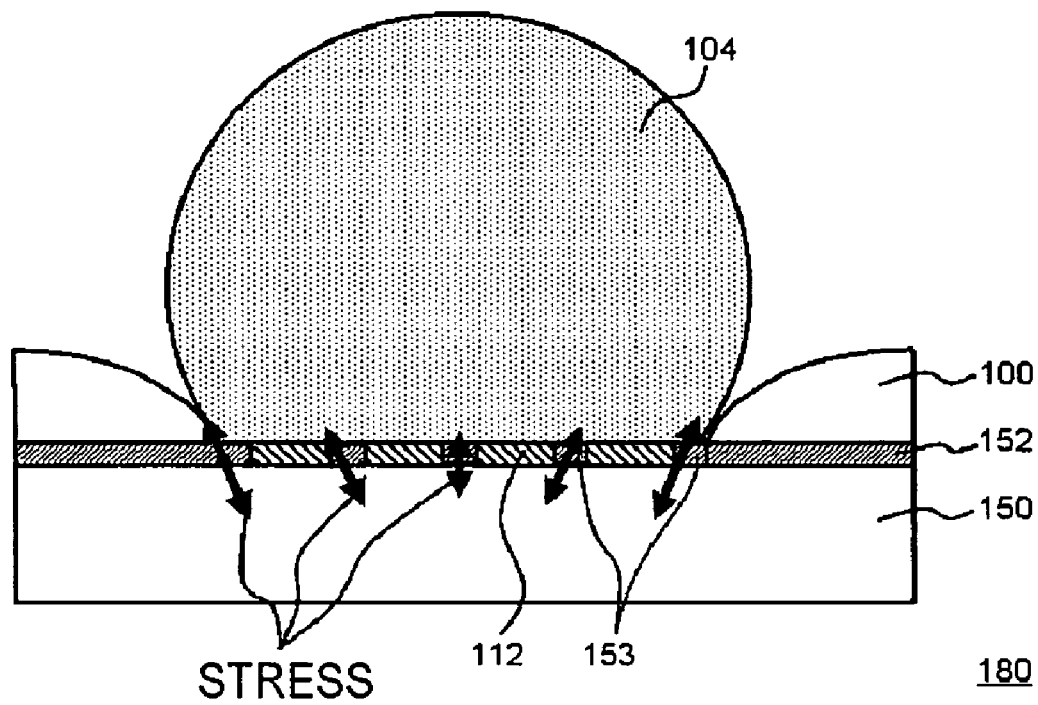
FIG. 5 is a cross-sectional view of the semiconductor device, schematically illustrating a stress exerted onto the semiconductor device according to first embodiment.

Therefore, as shown in FIG. 4, which is a partially exploded perspective view of the semiconductor device 100, the contact portions between the solder bump 104 and the UBMs 112 are provided as being divided into a plurality of independent small areas, so that the stress, which is otherwise exerted on the circumference edge of the contact surface between the solder bump 4 and the UBM 12 in the stress testing employing the conventional semiconductor device 90 (FIG. 13), is controlled to be exerted on circumferences of UBMs 112 consisting of a number of small circles, thereby providing a reduced stress exerted onto the UBMs 112.

Figure 13:
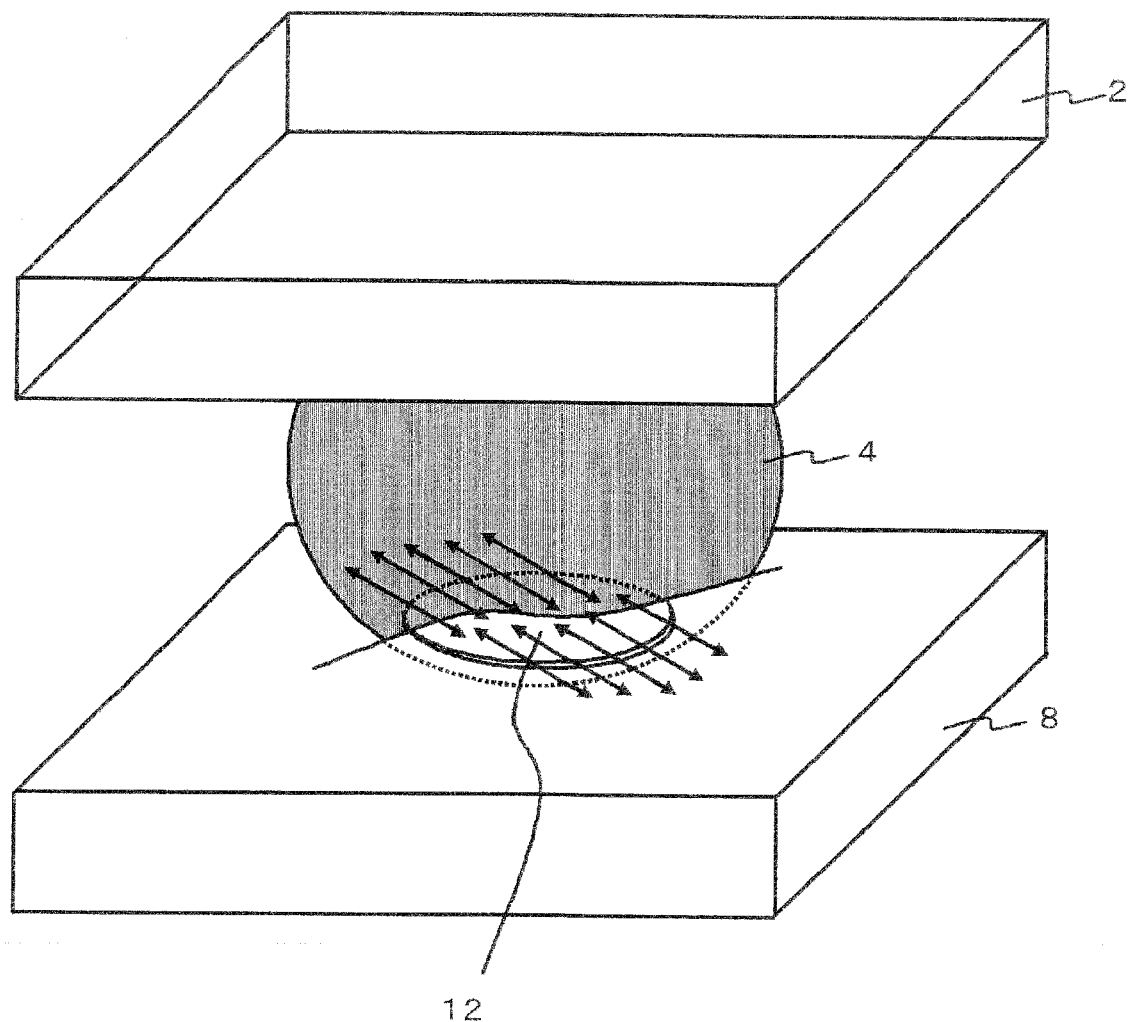
FIG. 13 is an partially exploded perspective view of the semiconductor device, schematically illustrating a stress exerted onto the semiconductor device according to conventional technology.

Here, directions of arrows shown in FIG. 4 and FIG. 13 indicate directions of the stresses exerted onto the UBMs (directions radially extending toward the circumference portion from the center of the semiconductor chip 108), and the lengths of the arrows indicate magnitudes of the stresses exerted onto the UBMs.

Accordingly, cracks generated in the aluminum electrode 150 and the semiconductor chip 108, which are disposed under the solder bump 104 and the UBMs 112, during the stress testing such as temperature cycling test can be inhibited.

In addition, in the conventional semiconductor device 90 shown in FIG. 14 described in Japanese Patent Laid-Open No. 2000-299,343, the UBM 12 is a continuous single body of an integral layers. On the other hand, in the structure 180 according to the present embodiment, the UBM 112 is not a continuous single body and is formed to have divided pattern. Therefore, an advantageous effect of a stress relaxation can be more effectively obtained.

In addition, since it is not necessary to take the wider width of the frame of the insulating film, the relaxation of the stress can be achieved, while inhibiting an increase in the electrode area and an increase in the contact resistance between the UBM and the metallic electrode.

In particular, spacings in a plurality of UBMs 112 are filled with the insulating films 153, and the insulating films 153 composed of plasma SiON is softer (flexible) than the UBM 112 composed of plated Ni. Consequently, the above-described stress can be more effectively relaxed.

In addition, spacings between a plurality of UBMs 112 are filled with the insulating films 153, instead of employing dedicated special layer films. Nevertheless, such insulating film 153 is also formed in the process for manufacturing the conventional semiconductor device 90.

Consequently, the process for manufacturing the conventional semiconductor device 90 can also be utilized without substantially changing the process to obtain the structure 180 and the semiconductor device 100, so that an increase in number of operations in the manufacturing process can be avoided, thereby reducing an increase in the manufacturing.

While the preferred embodiments of the present invention have been described above in reference to the annexed figures, it should be understood that the disclosures above are presented for the purpose of illustrating the present invention, and various configurations other than the above described configurations can also be adopted.

Figure 6:
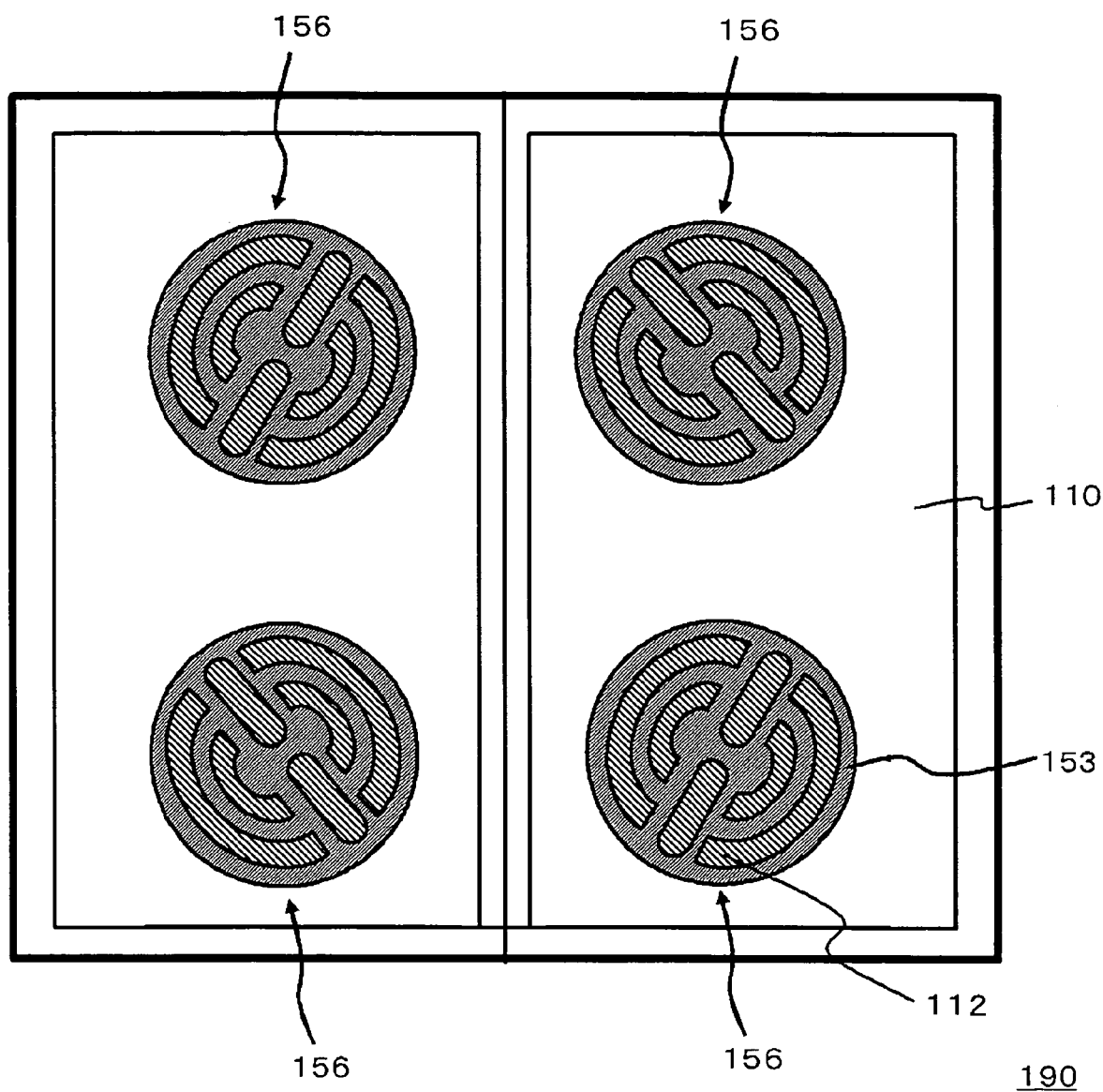
FIG. 6 is a plan view, schematically illustrating the semiconductor device according to first embodiment.

For example, as shown in FIG. 6, alternative configuration of forming insulating films 153 composed of several circular or segmented openings and disposing arc-shaped UBMs 112 in such openings to form mutually independent and isolated relationship thereof may also be employed.

The UBMs 112 of a structure 190 shown in FIG. 6 has a two-dimensional pattern, in which four arc-shaped UBMs and two ellipsoid like-shaped UBMs are provided in a single bonding region 156.

Here, in the region where arc-shaped UBMs and ellipsoid like-shaped UBMs are provided, the maximum length of such region along a stress direction radially extending from a center of the semiconductor chip 108 to a circumference thereof is shorter than the maximum length thereof along a direction perpendicular to the stress direction exerted on the UBM.

In addition, the arc-shaped UBM has a width along a radial direction that is smaller than the semi circle-shaped UBM provided in the inside of the bonding region 156 of the structure 180 shown in FIG. 1. More specifically, the structure 190 may be configured to have geometry of the opening presented by the location where the insulating film is provided and the correspondingly defined geometry of the UBM, which are different from the geometries thereof in the structure 180. In structure 190 shown in FIG. 6, a diameter of the bonding region 156 is 300 μm.

Figure 12:
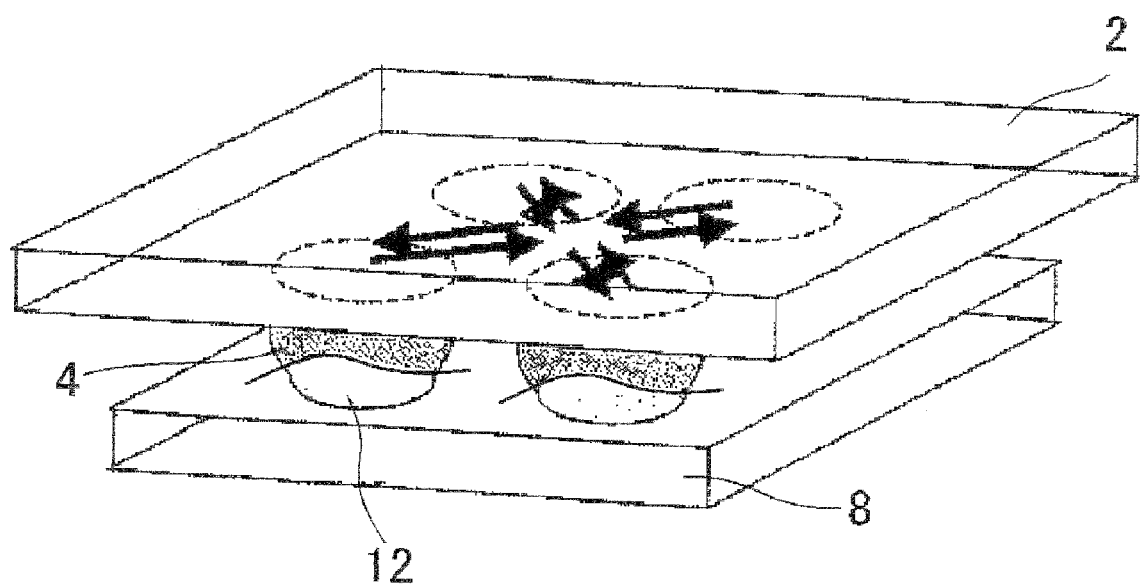
FIG. 12 is an partially exploded perspective view of the semiconductor device, schematically illustrating a stress exerted onto the semiconductor device according to conventional technology.

The process for manufacturing the structure 190 is almost similar to that for manufacturing the structure 180, and the structure 190 exhibits the advantageous effects that are almost similar to the advantageous effects of the structure 180. In addition to above, while stresses extending along the direction shown in FIG. 12 are exerted onto the solder bump 4 and the UBM (not shown) and the metallic electrode (not shown) during the temperature cycling test in the conventional technology, directions of stresses are taken into consideration in the design of the structure 190, and the geometry of the UBMs is designed to have a reduced dimension along the direction that a principal stress is exerted thereon as shown in FIG. 6, so that the stress exerted to the UBMs can be more effectively relaxed.

In addition to above, while the structure 190 employs the arc-shaped UBM having the maximum length in the direction identical to the stress direction that is shorter than maximum length in the direction perpendicular to the direction of the stress exerted to the UBM to more effectively relax the stress exerted to the UBM, other geometries except the arc-shaped geometry may also provides the advantageous effect of more effectively relaxing the stress, provided that the maximum length along the direction identical to the stress direction is shorter than the maximum length along the direction perpendicular to the direction of the stress exerted to the UBM.

In addition, while the configuration of employing the UBM having the substantially semi circular, half ring-shaped or arc-shaped two-dimensional geometry as shown in FIG. 1 and FIG. 6 is described in the above-described embodiment, concentric circular or smaller dot-patterned geometry may alternatively be employed, and even other geometries may also be employed provided that the use of the UBM having the geometry helps relaxing the stress exerted to the UBM.

In addition, while the configuration of providing the insulating films 153 composed of plasma SiON film to divide the UBM 112 into a plurality of regions is described in the above-described embodiment, other types of insulating materials such as $SiO_2$ film or polyimide may be employed as the material for the insulating film 153, in addition to a SiON film.

In addition, other type material except the insulating material such as metallic materials of silver, copper or the like may also be employed, provided that other material is different from the material composing the UBM 112 and is capable of being formed on the aluminum electrode 150, so that other material does not chemically react with the material composing the UBM 112 when other material is disposed in the spacings between a plurality of UBMs, thereby achieving the division of the UBMs 112 into a plurality of regions.

In addition, while the configuration employing the aluminum electrode 150 as the metallic electrode is described in the above-described embodiment, the material for the metallic electrode is not limited to aluminum, and copper, and an alloy containing these metallic materials may also be employed.

In addition, while the configuration employing nickel for UBM 112 is described in the above-described embodiment, the material for the UBM 112 is not limited to nickel, provided that the material is a metal that can provide an inhibition to the diffusion of solder into the metallic electrode and that is employed for a plating process.

In addition, while the configuration that the diameter of the bonding region 156 is 300 μm and the diameter of the insulating film region inside of the insulating film 153 is 150 μm is described in the above-described embodiment, such dimensions are presented for the purpose of the illustration only, and other dimensions may also be employed.

In addition to above, in the semiconductor chip 108 of the above described first example, the diffusion barrier film (UBM 112) is formed to present a pattern composing of a plurality of divided portions via spacings therebetween. Further, spacing films (insulating film 153) formed of a different material from the material for the diffusion barrier film are disposed respectively in the spacings between a plurality of diffusion barrier films. In addition to above, the name of "spacing film" is temporarily employed for specifying the film filling the spacing of the diffusion barrier film, and there is no specific semantics in the term.

On the contrary, the diffusion barrier film may be formed to be a single piece having slits that function as spacings. A structure 200 of a semiconductor chip having a diffusion barrier film formed to have such geometry will be briefly described in reference to FIG. 7 as second embodiment.

Figure 7:
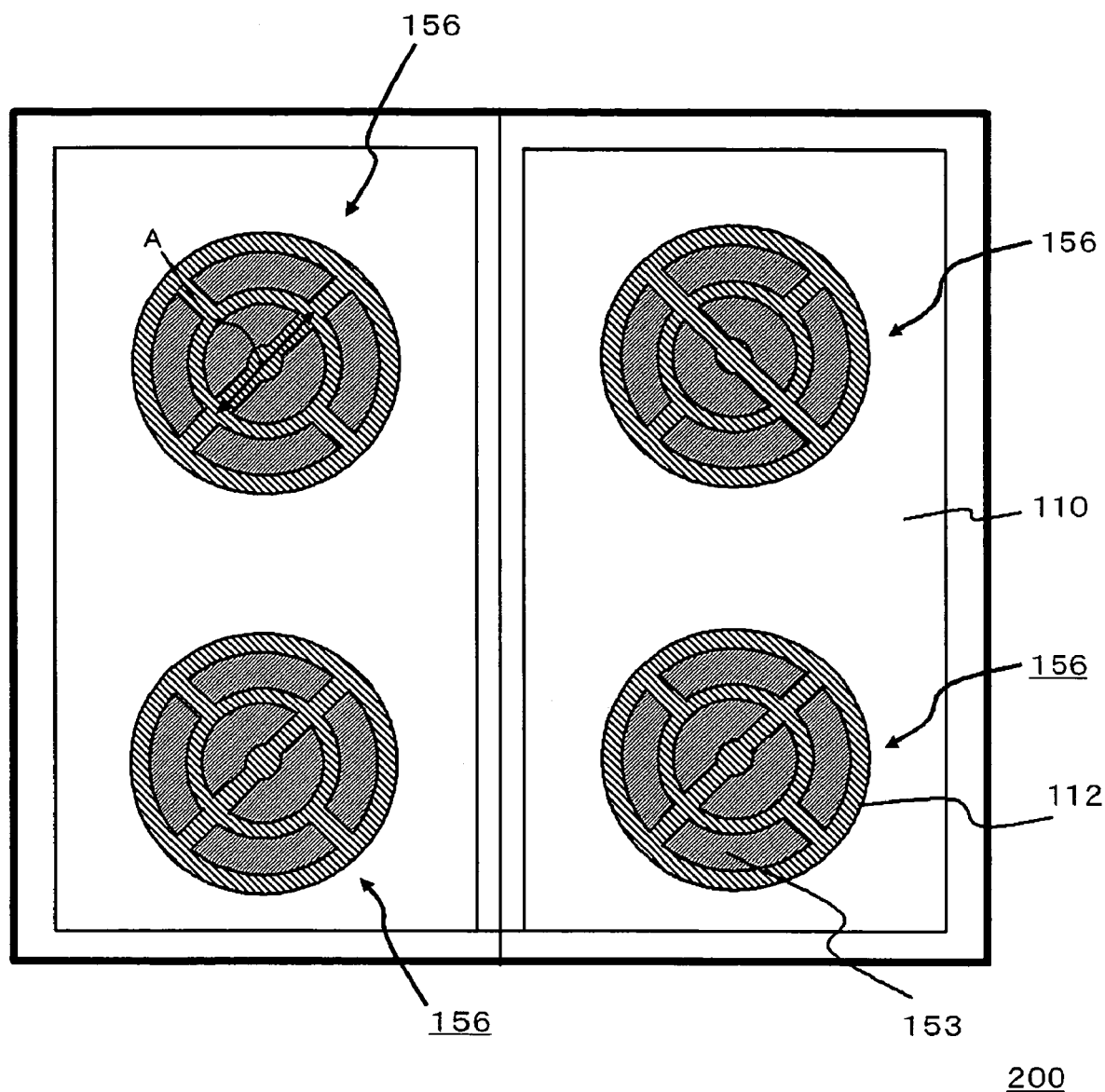
FIG. 7 is a plan view, schematically illustrating the semiconductor device according to first embodiment.
Figure 8:
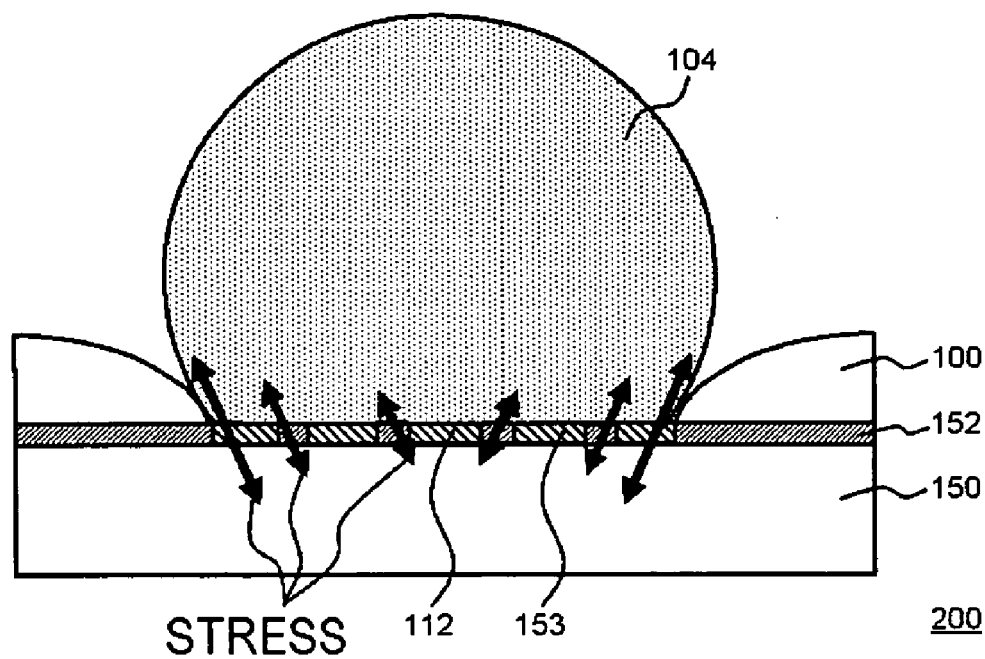
FIG. 8 is a cross-sectional view of the semiconductor device, schematically illustrating a stress exerted onto the semiconductor device according to second embodiment.
Figure 9:
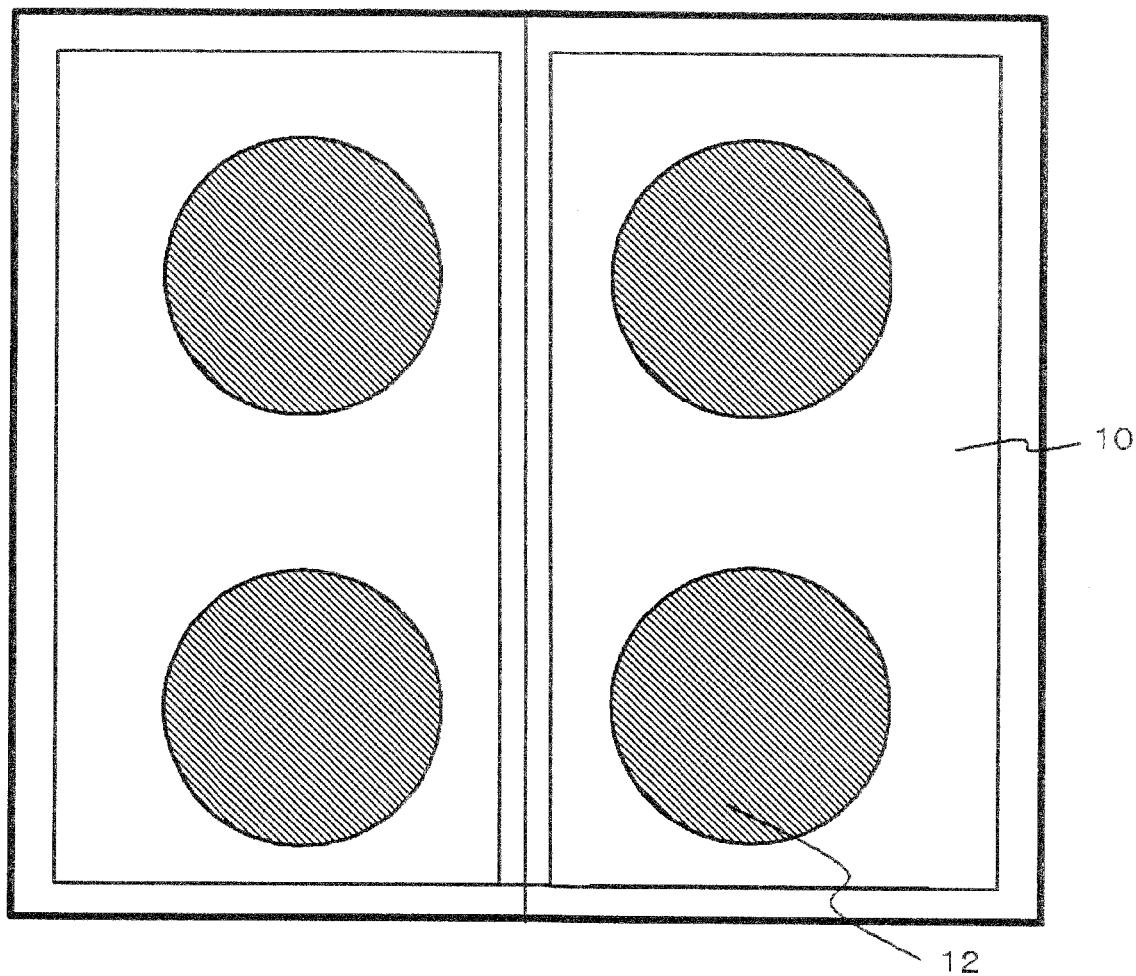
FIG. 9 is a plan view, schematically showing a semiconductor device according to the conventional technology.
Figure 10A:
FIGS. 10A to 10E are cross-sectional views of the semiconductor device, useful in describing a process for manufacturing the semiconductor device according to the conventional technology.
Figure 10B:
Figure 10C:
Figure 10D:
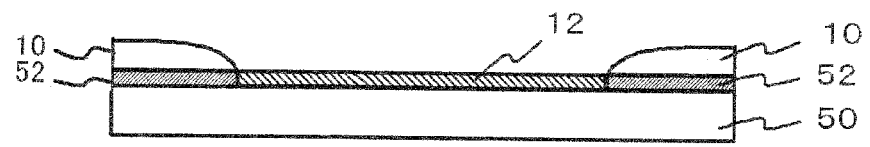
Figure 10E:
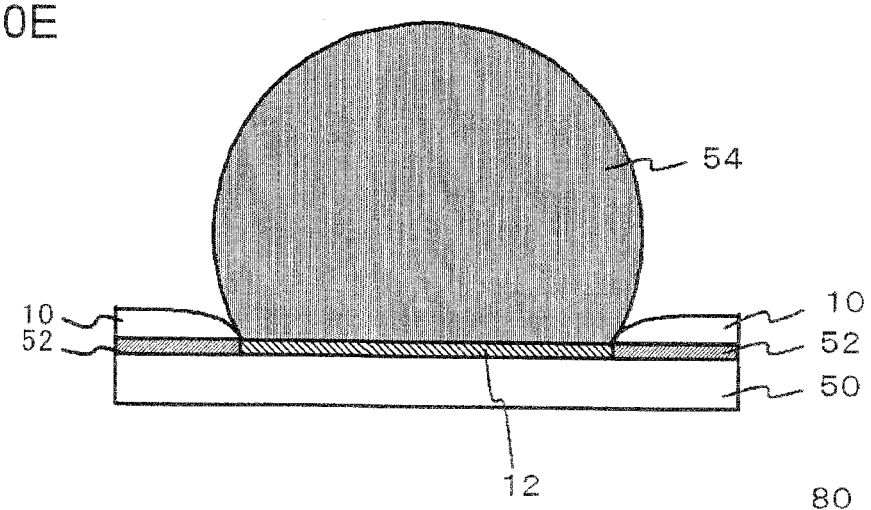
Figure 11:
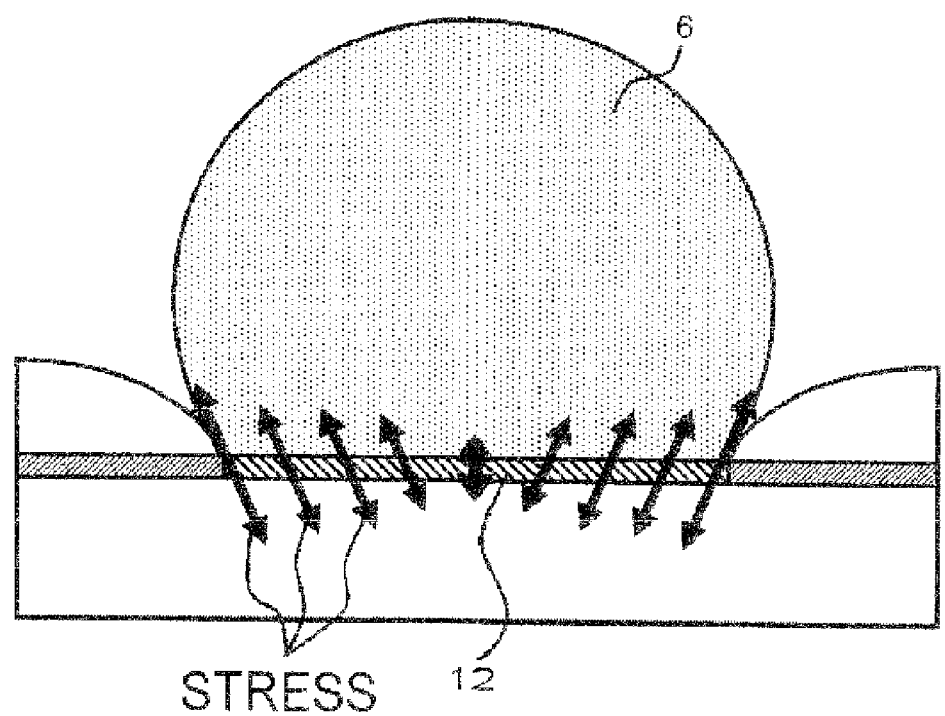
FIG. 11 is a cross-sectional view of the semiconductor device, schematically illustrating a stress exerted onto the semiconductor device according to the conventional technology.

In the structure 200 of the semiconductor chip, slits functioning spacings are formed in the UBM 112 and a spacing film 153 is formed in each of the slits, as shown in FIG. 7. In this case, the stress exerted onto the UBM 112 can be relaxed by the presence of the slit.

In addition, the above-described embodiment illustrates that the insulating films 153 is formed as spacing films in the spacings of the UBM 112 for preventing a diffusion of the material composing the bump 104. Nevertheless, the spacing film may also function as preventing a diffusion of the material composing the bump 104. In this case, an obstruction of the function of the UBM by the presence of the spacing film can be prevented.

Such spacing film may be composed of an organic material or of an inorganic material, and the material may be selected regardless of exhibiting an electroconductivity or without exhibiting an electroconductivity, and may be typically composed of, for example, polyimide, $SiO_2$, SiON, SiN or combination thereof.

It is apparent that the present invention is not limited to the above embodiment, that may be modified and changed without departing from the scope and spirit of the invention.

What is claimed is:

1. A semiconductor device, comprising:

a semiconductor chip having an electrode coupled to a mounting substrate via a bump formed on a surface thereof;

a diffusion barrier film for preventing a diffusion of a material composing said bump provided on a surface of said electrode, said diffusion barrier film being formed to have a geometry including a spacing; and a spacing film disposed in the spacing of said diffusion barrier film, said spacing film being an insulating film.

2. The semiconductor device according to claim 1, wherein said diffusion barrier film is formed to have a geometry, in which said diffusion barrier film is divided to be a plurality of portions, between which said spacing is disposed.

3. The semiconductor device according to claim 2, wherein plurality of said diffusion barrier films are configured to have a maximum length in radial direction from a center of said semiconductor chip to a circumference thereof, which is shorter than maximum length in a direction perpendicular to said radial direction.

4. The semiconductor device according to claim 1, wherein a slit, which is equivalent to said spacing, is formed in said diffusion barrier film.

5. The semiconductor device according to claim 1, wherein said spacing film is formed of a material that is capable of preventing a diffusion of the material composing said bump.

6. The semiconductor device according to claim 5, wherein said spacing film is formed of a material containing a main component of at least one selected from a group consisting of polyimide, $SiO_2$, SiON and SiN.

7. The semiconductor device according to claim 1, wherein the electrode of the semiconductor chip further comprises an aluminum electrode, and said mounting substrate and said semiconductor chip are electrically coupled to said bump via the aluminum electrode.

* * * * *

UNITED STATES PATENT AND TRADEMARK OFFICE
CERTIFICATE OF CORRECTION

PATENT NO. : 7,663,201 B2
APPLICATION NO. : 11/447966
DATED : February 16, 2010
INVENTOR(S) : Yukiko Yamada It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 831 days.

Signed and Sealed this

Fourth Day of January, 2011

David J. Kappos
*Director of the United States Patent and Trademark Office*